(12) United States Patent
Gaudiana et al.

(10) Patent No.: US 9,123,895 B2
(45) Date of Patent: Sep. 1, 2015

(54) PHOTOVOLTAIC CELL WITH THIAZOLE-CONTAINING POLYMER

(71) Applicant: Merck Patent GmbH, Darmstadt (DE)

(72) Inventors: Russell Gaudiana, Lyndeborough, NH (US); Richard Kingsborough, North Chelmsford, MA (US); Xiaobo Shi, Centennial, CO (US); David Waller, Lexington, MA (US); Zhengguo Zhu, Chelmsford, MA (US)

(73) Assignee: Merck Patent GmbH, Darmstadt (DE)

( * ) Notice: Subject to any disclaimer, the term of this patent is extended or adjusted under 35 U.S.C. 154(b) by 145 days.

(21) Appl. No.: 14/046,567

(22) Filed: Oct. 4, 2013

(65) Prior Publication Data

US 2014/0034129 A1 Feb. 6, 2014

Related U.S. Application Data

(62) Division of application No. 13/191,264, filed on Jul. 26, 2011, now Pat. No. 8,563,678, which is a division of application No. 11/851,591, filed on Sep. 7, 2007, now Pat. No. 8,008,424.

(60) Provisional application No. 60/850,845, filed on Oct. 11, 2006.

(51) Int. Cl.
| | | |
|---|---|---|
| H01L 51/00 | (2006.01) | |
| C08G 75/06 | (2006.01) | |
| C08G 61/12 | (2006.01) | |
| H01L 51/42 | (2006.01) | |

(52) U.S. Cl.
CPC .......... *H01L 51/0036* (2013.01); *C08G 61/123* (2013.01); *C08G 75/06* (2013.01); *H01L 51/4226* (2013.01); *Y02E 10/549* (2013.01)

(58) Field of Classification Search
CPC .. C08G 61/123; C08G 75/06; H01L 51/0036; H01L 51/4226; Y02E 10/549
USPC ............. 528/289, 27, 226, 377, 380; 136/263
See application file for complete search history.

(56) References Cited

U.S. PATENT DOCUMENTS

| | | |
|---|---|---|
| 4,292,092 A | 9/1981 | Hanak |
| 4,416,959 A | 11/1983 | Skotheim |
| 4,574,160 A | 3/1986 | Cull et al. |
| 4,639,328 A | 1/1987 | Krause et al. |
| 4,686,323 A | 8/1987 | Biter et al. |
| 4,746,618 A | 5/1988 | Nath et al. |
| 4,795,687 A | 1/1989 | Suzuki et al. |
| 4,913,744 A | 4/1990 | Hoegl et al. |
| 4,948,436 A | 8/1990 | Juergens |
| 5,071,490 A | 12/1991 | Yokota et al. |
| 5,221,363 A | 6/1993 | Gillard |
| 5,274,058 A | 12/1993 | Ferraris et al. |
| 5,510,438 A | 4/1996 | Ferraris et al. |
| 5,536,808 A | 7/1996 | Curtis et al. |
| 5,708,130 A | 1/1998 | Woo et al. |
| 6,109,330 A | 8/2000 | Crisp |
| 6,132,585 A | 10/2000 | Midorikawa et al. |
| 6,188,175 B1 | 2/2001 | May et al. |
| 6,198,091 B1 | 3/2001 | Forrest et al. |
| 6,198,092 B1 | 3/2001 | Bulovic et al. |
| 6,239,355 B1 | 5/2001 | Salafsky |
| 6,278,055 B1 | 8/2001 | Forrest et al. |
| 6,297,495 B1 | 10/2001 | Bulovic et al. |
| 6,333,458 B1 | 12/2001 | Forrest et al. |
| 6,352,777 B1 | 3/2002 | Bulovic et al. |
| 6,353,083 B1 | 3/2002 | Inbasekaran et al. |
| 6,399,224 B1 | 6/2002 | Li |
| 6,440,769 B2 | 8/2002 | Peumans et al. |
| 6,451,415 B1 | 9/2002 | Forrest et al. |
| 6,464,762 B1 | 10/2002 | Arao |
| 6,580,027 B2 | 6/2003 | Forrest et al. |
| 6,657,378 B2 | 12/2003 | Forrest et al. |
| 6,772,817 B2 | 8/2004 | Lai et al. |
| 6,818,260 B2 | 11/2004 | Farrand et al. |
| 6,864,333 B2 | 3/2005 | Dall'Occo et al. |
| 7,095,044 B2 | 8/2006 | Brown et al. |
| 7,105,237 B2 | 9/2006 | Sotzing |
| 7,196,366 B2 | 3/2007 | Forrest et al. |
| 7,309,833 B2 | 12/2007 | Robeson et al. |
| 7,368,510 B2 | 5/2008 | Lee et al. |
| 7,405,775 B2 | 7/2008 | Nilsson |
| 2002/0040728 A1 | 4/2002 | Yoshikawa |
| 2002/0050289 A1 | 5/2002 | Wada et al. |
| 2002/0105005 A1 | 8/2002 | Seo et al. |
| 2003/0008172 A1 | 1/2003 | Leclerc et al. |

(Continued)

FOREIGN PATENT DOCUMENTS

| | | |
|---|---|---|
| DE | 31 21 350 | 7/1982 |
| DE | 103 26 547 | 1/2005 |

(Continued)

OTHER PUBLICATIONS

Kong et al. "Single-Walled Carbon Nanotube Gold Nanohybrids: Application in Highly Effective Transparent and Conductive Films", J. Phys. Chem. C 2007, 111, p. 8377-8382.
Peng et al. "Synthesis and electroluminescent properties of copolymers based on fluorene and 2,5-di(2-hexyloxyphenyl)thiazolothiazole" Macromolecules 38, 7292-7298 (2005).
Ando et al. "synthesis, physical properties, and field-effect transistors of novel thiophene/thiazolothiazole co-loligomers" J. Mater. Chem. 14, 1787-1790(2004).
Gao et al. "Efficient photodetectors and photovoltaic cells from composites of fullerenes and conjugated polymers: photimduced electron transfer" Synthetic Metal 84, 979-980(1997).

(Continued)

*Primary Examiner* — Ling Choi
*Assistant Examiner* — Chun-Cheng Wang
(74) *Attorney, Agent, or Firm* — Bowditch & Dewey, LLP; Roger P. Zimmerman

(57) ABSTRACT

Photovoltaic cells with thiazole-containing polymers, as well as related components, systems, and methods, are disclosed.

18 Claims, 1 Drawing Sheet

(56) References Cited

U.S. PATENT DOCUMENTS

| | | |
|---|---|---|
| 2003/0023029 A1 | 1/2003 | Wang et al. |
| 2003/0036612 A1 | 2/2003 | Nifant'ev et al. |
| 2003/0042471 A1 | 3/2003 | Giles et al. |
| 2003/0102024 A1 | 6/2003 | Zeira |
| 2003/0127967 A1 | 7/2003 | Tsutsui et al. |
| 2003/0159729 A1 | 8/2003 | Shaheen et al. |
| 2003/0175411 A1 | 9/2003 | Kodas et al. |
| 2003/0188777 A1 | 10/2003 | Gaudiana et al. |
| 2003/0189402 A1 | 10/2003 | Gaudiana et al. |
| 2003/0230335 A1 | 12/2003 | Tsukahara |
| 2004/0118448 A1 | 6/2004 | Scher et al. |
| 2004/0187911 A1 | 9/2004 | Gaudiana et al. |
| 2004/0192871 A1 | 9/2004 | Wang et al. |
| 2004/0201018 A1 | 10/2004 | Yamahara et al. |
| 2004/0256615 A1 | 12/2004 | Sirringhaus et al. |
| 2005/0022865 A1 | 2/2005 | Robeson et al. |
| 2005/0124784 A1 | 6/2005 | Sotzing |
| 2005/0145972 A1 | 7/2005 | Fukuda et al. |
| 2005/0224905 A1 | 10/2005 | Forrest et al. |
| 2006/0022192 A1 | 2/2006 | Brabec et al. |
| 2006/0027834 A1 | 2/2006 | Forrest et al. |
| 2006/0076050 A1 | 4/2006 | Williams et al. |
| 2006/0141662 A1 | 6/2006 | Brabec et al. |
| 2006/0155106 A1 | 7/2006 | Roberts et al. |
| 2007/0014939 A1 | 1/2007 | Gaudiana et al. |
| 2007/0017571 A1 | 1/2007 | Gaudiana et al. |
| 2007/0020526 A1 | 1/2007 | Gaudiana et al. |
| 2007/0120045 A1 | 5/2007 | Yokoyama |
| 2007/0158620 A1 | 7/2007 | Gaudiana et al. |
| 2007/0181179 A1* | 8/2007 | Brabec et al. .......... 136/263 |
| 2007/0193621 A1 | 8/2007 | Brabec et al. |
| 2007/0289626 A1* | 12/2007 | Brabec et al. .......... 136/263 |
| 2008/0053518 A1 | 3/2008 | Change et al. |
| 2008/0264488 A1 | 10/2008 | Balasubramanian |

FOREIGN PATENT DOCUMENTS

| | | |
|---|---|---|
| DE | 69330835 | 2/2007 |
| EP | 0 251 598 | 1/1988 |
| EP | 1 065 725 | 1/2001 |
| EP | 1318553 | 6/2003 |
| EP | 1507298 | 2/2005 |
| EP | 1562154 | 8/2005 |
| JP | 04-192376 | 7/1992 |
| JP | 2001 060707 | 3/2001 |
| JP | 2002-141524 | 5/2002 |
| JP | 03-073382 | 3/2003 |
| JP | 2003-515933 | 5/2003 |
| JP | 2003 264085 | 9/2003 |
| JP | 04-534863 | 6/2004 |
| JP | 05-011841 | 1/2005 |
| JP | 06-166746 | 6/2006 |
| JP | 06-278682 | 10/2006 |
| KR | 100685796 | 2/2007 |
| WO | WO 93/05077 | 3/1993 |
| WO | WO 94/14199 | 6/1994 |
| WO | WO 97/05184 | 2/1997 |
| WO | WO 00/11725 | 3/2000 |
| WO | WO 00/22682 | 4/2000 |
| WO | WO 00/46321 | 8/2000 |
| WO | WO 01/39276 | 5/2001 |
| WO | WO 02/059121 A1 | 8/2002 |
| WO | WO 02/101838 | 12/2002 |
| WO | WO 03/065462 | 8/2003 |
| WO | WO 2004/042824 | 5/2004 |
| WO | WO 2004/051756 | 6/2004 |
| WO | WO 2005/092947 | 10/2005 |
| WO | WO 2005/111045 | 11/2005 |
| WO | WO 2007/011739 | 1/2007 |
| WO | WO 2007022226 | 2/2007 |
| WO | WO 2007/076427 | 7/2007 |
| WO | WO 2007/121252 | 10/2007 |
| WO | WO 2007/133705 | 11/2007 |
| WO | WO 2007/145482 | 12/2007 |
| WO | WO 2008/000664 | 1/2008 |
| WO | WO 2010/008672 | 1/2010 |

OTHER PUBLICATIONS

Barbarella et al., "Oligothiophene-S,S dioxides: a New Class of Thiophene based Materials", Journal of Organic Chemistry, Optical Materials, 9 (1998) 43-45.

European Search Report dated Feb. 24, 2011, Application No. 10177632.6.

International Preliminary Report on Patentability dated Feb. 8, 2011 issued in PCT/US2009/049701.

Jayakanna, et al., "Synthesis and Structure-Property Relationship of New Donor-Acceptor-Type Conjugated Monomers on the Basis of Thiophene and Benzothiadiazole", Journal of Polymer Science Part A: Polymer Chemistry, vol. 40, 251-261 (2002).

Kunai et al., "Synthesis and properties of silicon-bridged bithiophenes and application to EL devices," Synthetic Metals, Elsevier Sequoia Lausanne, CH, vol. 137, No. 1-3, Jan. 1, 2003, pp. 1007-1008.

Supplemental European Search Report dated Mar. 4, 2011, Application No. 07872313.7.

Supplemental European Search Report dated Mar. 4, 2011, Application No. 06787321.6.

Ahmed, et al., "Benzobisthiazole-Thiophene Copolymer Semiconductors: Synthesis, Enhanced Stability, Field-Effect Transistors, and Efficient Solar Cells", Macromolecules 2009, 42, 8615-8618.

Ando, et al., "Characterization and Field-Effect Transistor Performance of Heterocyclic Oligomers Containing a Thiazolothiazole Unit", Chemistry Letter vol. 33, No. 9, 1170-1171 (2004).

Chen, et al., "Polymer solar cells with enhanced open-circuit voltage and efficiency", Nature Photonics, vol. 3, 649-653, Nov. 2009.

European Search Report dated Nov. 10, 2010, Application No. 10177632.6.

Hou, et al., "Synthesis, Characterization, and Photovoltaic Properties of a Low Band Gap Polymer Based on Silole-Containing Polythiophenes and 2, 1, 3-Benzothiadiazole", J. Am. Chem. Soc. 2008, 130, 16144-16145.

Hou, et al., "Bandgap and Molecular Energy Level Control of Conjugated Polymer Photovoltaic Materials Based on Benzo[1,2-b:4,5-b']dithiophene", Macromolecules 2008, 41, 6012-6018.

International Search Report dated Jan. 27, 2011, PCT/US2010/026222.

Li, et al "High-efficiency solution processable polymer photovoltaic cells by self-organization of polymer blends", Nature Materials vol. 4, 864-868, Nov. 2005.

Liu et al., "Efficient green-light-emitting diodes from silole-containing copolymers", 15, 3496-3500 (2003).

Maksudul, et al., "Polybenzobisazoles Are Efficient Electron Transport Materials for Improving the Performance and Stability of Polymer Light-Emitting Diodes", Chem. Mater. 2002, 14, 4775-4780.

Mike, et al., "Facile Synthesis of 2, 6-Disubstituted Benzobisthiazoles: Functional Monomers for the Design of Organic Semiconductors", J. Org. Chem. 2010, 75, 495-497.

Mike, et al., An Efficient Synthesis of 2, 6-Disubstituted Benzobisoxazoles: New Building Blocks for Organic Semiconductors, Org. Lett., vol. 10, No. 21, 4915-4918, 2008.

Hiramoto et al., "Design of nanostructures for photoelectric conversion using an organic vertical superlattice," Appl. Phys. Letters, 88:213105, 2006.

Osahen, et al., "Electroactive and Photoactive Rod-Coil Copolymers: Design, Synthesis, and Supramolecular Regulation of Photophysical Properties", J. Am. Chem. Soc. 1995, 117, 7389-7398.

Osaka, et al., "Novel Thiophene-Thiazolothiazole Copolymers for Organic Field-Effect Transistors", Adv. Mater. 2007, 19, 4160-4165.

Osaka, et al., "High-Lamellar Ordering and Amorphous-Like it-Network in Short-Chain Thiazolothiazole-Thiophene Copolymers Lead to High Mobilitiesz", J. Am. Chem. Soc. 2009, 131, 2521-2529.

Takamoto et al., "Two-Terminal Monolithic Ino.5Gao.5P/GaAs Tandem Solar Cells with a High Conversion Efficiency of Over 30%," Jap. J. Appl. Physics, 36(10):6215-6220.

(56) References Cited

OTHER PUBLICATIONS

Umeda et al., "Fabrication of Interpenetrating Semilayered Structure of Conducting Polymer and Fullerene by Solvent Corrosion Method and Its Photovoltaic Properties," Jap. J. Appl. Physics, 44(6A):4155-4160, 2005.
Xue, et al., "Asymmetric tandem organic photovoltaic cells with hybrid planar-mixed molecular heterojunctions," Appl. Phys. Letters, 85(23):5757-5759, 2004.
Yakimov et al., "High photovoltage multiple-heterojunction organic solar cells incorporating interfacial metallic nanoclusters," Applied Physics Letters, vol. 80, No. 9, Mar. 2002.
Yamaguchi et al., "Multi-junction III-V solar cells: current status and future potential," Solar Energy, 79(1):78-85, 2005.
Peet et al.,"Efficiency enhancement in low-bandgap polymer solar cells by processing with alkane dithiols," Nat. Mat., 6:497-500, 2007.
Shrotriya, V., "Plastic Solar Cells", Organic Semiconductor Conference, 1-33 (2009).
So, et al "Synthesis and Photophysical Properties of Some Benzoxazole and Benzothiazole Compounds", Macromolecules 1996, 29, 2784-2795.
Zhang, et al., "Polymer Solar Cells Based on a Low-Bandgap Fluorene Copolymer and a Fullerene Derivative with Photocurrent Extended to 850 nm", Adv. Funct. Mater. 2005, No. 15, 745-750.
Swager et al., "The molecular wire approach to sensory signal amplifiers," Acc. Chem. Res., 1998, 31, 201-207.
Van Duren, "R.A.J. Low-bandgap Polymer Photovoltaic Cells," Synthetic Metals, 121:1587-1588, 2001.
Zhou et al., "Fluorene based low band gap copolymers for photovoltaic devices," Applied Physics Letters, vol. 84, No. 10, 1653-1655, Mar. 8, 2004.
A. C. Arias, et al., Vertically segregated polymer-blend photovoltaic thin-film structures through surface-mediated solution processing, applied physics letters, vol. 80, No. 10 Mar. 11, 2002.
Anthony M Higgins, et al., "Surface segregation and self-stratification in blends of spin-cast polyfluorene derivatives", J. Phys.: Condens. Matter 17 (2005) 1319-1328.
Hwajeong Kim, et al., "Distinct Annealing Temperature in Polymer:Fullerene:Polymer Ternary Blend Solar Cells", J. Phys. Chem. C, 2009, 113 (4), 1620-1623 DOI: 10.1021/ jp809589n, Publication Date (Web): Jan. 5, 2009.
Gadisa et al., "Improvements of fill factor in solar cells based on blends of polyfluorene copolymers as electron donors," Thin Solid Films, 515:3126-3131, (2007).
Kim et al., "Influence of electron-donating polymer addition on the performance of polymer solar cells," J. Phys. D: Appl. Phys., 41:1-5, (2008).
Winder et al., "Sensitization of low bandgap polymer bulk heterojunction solar cells," Thin Solid Films, 403-404:373-379, (2002).
Wong et al., "Efficient photovoltaic cells with wide photosensitization range fabricated from rhenium benzathiazole complexes," App. Phys. Letters, 90:1-3, (2007).
Hu and Matsumura, "Structure and thickness dependence of p-n heterojunction solar cells based on copper phthalocyanine and perylene pigments", Institute of Physics Publishing Journal of Physics D: Applied Physics, J. Phys. D: Appl. Phys., 37:1434-1438 (2004).
Peumans et al.,"Efficient photon harvesting at high optical intensities in ultrathin organic double-heterostructure photovoltaic diodes", American Institute of Physics, Applied Physics Letter, 76(19):2650-2652 (2000).
Roman et al., "High Quantum Efficiency Polythiophene/C60 Photodiodes," Adv. Mat., 10:774-777, 1998.
Jespersen et al., "The electronic states of polyfluorene copolymers with alternating donor-acceptor units," J. Chem. Phy., 121(24):12613-12617, 2004.
Sensfuss et al., Characterisation of potential donor acceptor pairs for polymer solar cells by ESR, optical and electrochemical investigations, vol. 5215, Proc. of SPIE129-140, 2004.

Baumgartner, "π-Conjugated Heterocyclic fused Bithiophene Materials," J. Inorganic and Organometallic Polymers and Materials, 15(4):389-409, 2005.
Coppo et al., "New routes to poly(4,4-dialkylcyclopentadithiophene-2,6-diyls)," J. Mater. Chem., 12:2597-2599, 2002.
Muhlbacher et al., "High Photovoltaic Performance of a Low-Bandgap Polymer," Adv. Mater., 18:2884-2889, 2006.
Usta et al., "Dithienosilole- and Dibenzosilole- Thiophene Copolymers as Semiconductors for Organic Thin-Film Transistors," J. Am. Chem., 128:9034-9035, 2006.
Zhu et al., "Panchromatic Conjugated Polymers Containing Alternation Donor/Acceptor Units for Photovoltaic Applications," Macromolecules, 40:1981-1986, 2007.
Hiramoto et al., "Effect of Thin Gold Interstitial-layer on the Photovoltaic Properties of Tandem Organic Solar Cell," Chemistry Letters, The Chemistry Society of Japan, pp. 327-330, 1990.
Liao et al., "Photovoltaic Dithienosilole-Containing Polymers," Macromoleculs, vol. 40, pp. 9406-9412 (2007).
Niu, Applied Physics Letters, 2003, vol. 82, No. 13, 2163-2165.
Ohshita et al., "Synthesis of Polymers Composed of Alternating Diphenylenedithienosilole and Diethynylenesilyene Units and Their Applications to Hole Transport in Double-Layer EL Devices" Macromolecules, vol. 33, pp. 8890-8893 , 2000. Entire document, especially Scheme 1, p. 8890; Table 2.
Plater et al., "Cyclopenta-1,2,3-dithiazoles and related compounds," J. Chem.. Soc., Perkin Trans. 1, Issue 7, 769-774, 1993. Abstract.
Asawapirom et al., "Dialkylcyclopentadithiophene Polymers and Copolymers," Macromolecular Rapid Communications, 22:746-749, 2001.
Bakhshi et al., "Ab initio study of the electronic structures and conduction properties of some donor-acceptor polymers and their copolymers," Journal of Chemical Physics, 119:13159-13169, 2003.
Bakhshi et al., "Electronic Structures of Donor-Acceptor Polymers Based on Polythiophene, Polyfuran and Polypyrrole," Molecular Engineering, 6:239-248, 1996.
Bakhshi et al., "Strategies for Molecular Designing of Novel Low-Band-Gap Electrically Conducting Polymers," Applied Biochemistry and Biotechnology, 96:125-133, 2001.
Berlin et al., "Self-assembly of mono- and multilayers of polyconjugated conducting polymers," Macromolecular Rapid Communications, 21:301-318, 2000.
Berlin et al., "Thiophene/Cyclopentadiene Regular Copolymers from Electrochemical Oxidation of Dithienylcyclopentadienes," Macromolecular Chemistry and Physics, 203:1228-1237, 2002.
Coppo et al., "Cyclopentadithiophene based electroactive materials," J Mater. Chem., 15:1123-1133, 2005.
Coppo et al., "Investigation of the electronic properties of cyclopentadithiophene polymers and copolymers," Mat. Res. Soc. Symp. Proc., 771:L4.9.1-L4.9.4, 2003.
Coppo et al., "Synthesis, solid state structure and polymerisation of a fully planar cyclopentadithiophene," Chem. Commun., 2548-2549, 2003.
Coppo et al., "Synthetic Routes to Solution-Processable Polycyclopentadithiophenes," Macromolecules, 35:2705-2711, 2003.
Cravino et al., "Double-cable polymers for fullerene based organic optoelectronic applications," J. Mater. Chem., 12:1931-1943, 2002.
Cravino et al., "Nanostructured Bipolar Organic Polymers," Encyclopedia of Nanoscience and Nanotechnology, 7:615-628.
Dai, "Conjugated and Fullerene-Containing Polymers for Electronic and Photonic Applications: Advanced Syntheses and Microlithographic Fabrications," Journal of Macromolecular Science, Part C—Reviews in Macromolecular Chemistry and Physics, 39:273-387, 1999.
Huang et al., "A Donor-Acceptor Conducting Copolymer with a Very Low Band Gap and High Intrinsic Conductivity," Chem. Mater., vol. 10, No. 8, pp. 2212-2216, (1998).
Huang et al., "In-situ conductivity of a low band-gap conducting polymer. Measurement of intrinsic Conductivity," Acta Polymerica, vol. 48(10), (1997).
Huang et al., "Oxygen-Modified Poly(4-dicyanomethylene-4H-cyclopenta[2,1-b;3,4-b]dithiophene: A Tunable Low band Gap Polymer," Chem. Mater., vol. 11, No. 6, pp. 1541-1545, (1999).

(56) References Cited

OTHER PUBLICATIONS

Ko et al., "Electrochemistry and electrochromism of a poly(cyclopentadithiophene) derivative with a viologa pendant," Electrochimica Acta. vol. 48, pp. 4127-4135, (2003).
Kunugi et al., "Charge transport in a regioregular poly(3-octylthiophene) film," J Mater. Chem., 10:2673-2677, 2000.
Larmat et al., "Comparative Reactivity of Thiophene and 3,4-(Ethylenedioxy) thiophene as Terminal Electropolymerizable Units in Bis-Heterocycle Arylenes," Journal of Polymer Science: Part A: Polymer Chemistry, 35:3627-3636, 1997.
Prato, "Fullerene Materials," Topics in Current Chemistry, 199:173-187, 1999.
Roncali, "Linear π-conjugated systems derivatized with C60-fullerene as molecular heterojunctions for organic photovoltaics," Chem. Soc. Rev., 34:483-495, 2005.
Roncali, "Linear π-conjugated systems with tailored electronic properties," Annu. Rep. Prog. Chem., Sect. C, 95:47-88, 1999.
Scherf et al., "Semiconducting Polyfluorenes—Towards Reliable Structure—Property Relationships," Advanced Materials, 14:477-487, 2002.
Subramanian et al., "Trends in Geometric and Electronic Properties of Thiophene- and CyclopentadieneBased Polymers," International Journal of Quantum Chemistry, 66:229-240, 1998.
Wang et al., "Conjugated Fluorene and Silole Copolymers: Synthesis, Characterization, Electronic Transition, Light Emission, Photovoltaic Cell, and Field Effect Hole Mobility," Macromolecules, 38:2253-2260, 2005.
Wu et al., "Low band gap-conjugated polymer derivatives," Synthetic Metals. vol. 155, pp. 618-622 (2005).
Yonezawa et al., "Preparation and properties of oligomers containing cyclopentadithiophene," Synthetic Metals, 119:99-100, 2001.
Yoon et al., "Organic Thin-Film Transistors Based on Carbonyl-Functionalized Quaterthiophenes: High Mobility N-Channel Semiconductors and Ambipolar Transport," J. Am. Chem. Soc. vol. 127, pp. 1348-1349, (2005).
Zotti et al., "Novel, Highly Conducting, and Soluble Polymers from Anodic Coupling of Alkyl-Substituted Cyclopentadithiophene Monomers," Macromolecules, 27:1938-1942, 1994.
Zotti et al., "Polymers, Dimers and Radical Cations from Electrochemical Oxidation of Interring-Bridged Thiophene and Thiophene-Phenylene Tetramers," Macromolecular Chemistry and Physics, 202:3049-3056, 2001.
Bjorstrom et al., "Multilayer formation in spin-coated thin films of low-bandgap polyfluorene:PCBM blends," J. Phys. Condens. Matter 17:L529-L534, 2005.
Drechsel et al., "High efficiency organic solar cells based on single or multiple PIN structures," Thin Solid Films, vol. 451-452:515-517, 2004.
Greenham et al., "Charge separation and transport in conjugated polymer/cadmium selenide nanocrystal composites studied by photoluminescence quenching and photoconductivity," Synthetic Metals, 84:545-546, 1997.

* cited by examiner

PHOTOVOLTAIC CELL WITH THIAZOLE-CONTAINING POLYMER

This application is a divisional and claims benefit of U.S. application Ser. No. 13/191,264, filed Jul. 26, 2011, which is a divisional and claims benefit of U.S. application Ser. No. 11/851,591, filed Sep. 7, 2007, now U.S. Pat. No. 8,008,424, which in turn claims benefit of U.S. Provisional Patent Application Ser. No. 60/850,845, filed Oct. 11, 2006. The entire contents of each of the applications are hereby incorporated by reference.

STATEMENT REGARDING FEDERALLY SPONSORED RESEARCH

This invention was supported by contract number W911QY-04-C-0070 awarded by the Defense Advanced Research Projects Agency. The U.S. Government has certain rights in the invention.

TECHNICAL FIELD

This invention relates to photovoltaic cells with thiazole-containing polymers, as well as related components, systems, and methods.

BACKGROUND

Photovoltaic cells are commonly used to transfer energy in the form of light into energy in the form of electricity. A typical photovoltaic cell includes a photoactive material disposed between two electrodes. Generally, light passes through one or both of the electrodes to interact with the photoactive material. As a result, the ability of one or both of the electrodes to transmit light (e.g., light at one or more wavelengths absorbed by a photoactive material) can limit the overall efficiency of a photovoltaic cell. In many photovoltaic cells, a film of semiconductive material (e.g., indium tin oxide) is used to form the electrode(s) through which light passes because, although the semiconductive material can have a lower electrical conductivity than electrically conductive materials, the semiconductive material can transmit more light than many electrically conductive materials.

SUMMARY

This invention relates to photovoltaic cells with thiazole-containing polymers (e.g., polymers containing a bithiazole, cyclopentadithiazole, or thiazolothiazole moiety), as well as related components, systems, and methods.

An aspect of the invention relates to new combinations of monomers for preparing polymers, which have properties suitable for use as charge carriers in the active layer of a photovoltaic cell.

In one aspect, this invention features a polymer including a first comonomer repeat unit comprising a cyclopentadithiazole moiety; and a second comonomer repeat unit different from the first comonomer repeat unit.

In another aspect, this invention features a polymer including a first comonomer repeat unit comprising a thiazolothiazole moiety; and a second comonomer repeat unit different from the first comonomer repeat unit. The second comonomer repeat unit is not a phenyl moiety or a fluorene moiety.

In another aspect, this invention features a polymer including a first comonomer repeat unit comprising a thiazole moiety; and a second comonomer repeat unit different from the first comonomer repeat unit. The second comonomer repeat unit is not a thiophene moiety or a fluorene moiety.

In still another aspect, this invention features an article that includes a first electrode, a second electrode, and a photoactive material disposed between the first and second electrodes. The photoactive material includes a polymer described above. The article is configured as a photovoltaic cell.

Embodiments can include one or more of the following features.

In some embodiments, the first comonomer repeat unit includes a cyclopentadithiazole moiety of formula (1):

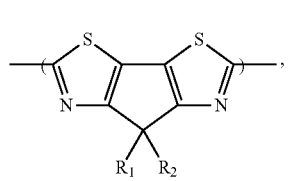

(1)

in which each of $R_1$ and $R_2$, independently, is H, $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, or $SO_2R$; R being H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl. For example, each of $R_1$ and $R_2$, independently, can be $C_1$-$C_{20}$ alkoxy or $C_1$-$C_{20}$ alkyl optionally substituted with $C_1$-$C_{20}$ alkoxy or halo.

In some embodiments, the first comonomer repeat unit comprises a thiazole moiety of formula (23):

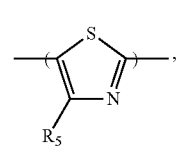

(23)

in which $R_5$ is H, $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, or $SO_2R$; R being H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl. For example, $R_5$ can be hexyl.

In some embodiments, the first comonomer repeat unit comprises a thiazolothiazole moiety of formula (25):

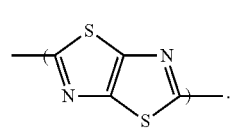

(25)

In some embodiments, the second comonomer repeat unit includes a silacyclopentadithiophene moiety, a benzothiadiazole moiety, a thiadiazoloquinoxaline moiety, a cyclopentadithiophene moiety, a cyclopentadithiophene oxide moiety, a benzoisothiazole moiety, a benzothiazole moiety, a thiophene oxide moiety, a thienothiophene moiety, a thienothiophene oxide moiety, a dithienothiophene moiety, a dithienothiophene oxide moiety, a tetrahydroisoindole moiety, a fluorene moiety, a fluorenone moiety, a thiazole moiety, a selenophene moiety, a silole moiety, a thiazolothiazole moiety, a cyclopentadithiazole moiety, a naphthothiadiazole moiety, a thienopyrazine moiety, a thiophene moiety, an oxazole moiety, an imidazole moiety, a pyrimidine moiety, a benzoxazole moiety, or a benzimidazole moiety.

In some embodiments, the second comonomer repeat unit includes a cyclopentadithiazole moiety of formula (1), a benzothiadiazole moiety of formula (2), a thiadiazoloquinoxaline moiety of formula (3), a cyclopentadithiophene dioxide moiety of formula (4), a cyclopentadithiophene monoxide moiety of formula (5), a benzoisothiazole moiety of formula (6), a benzothiazole moiety of formula (7), a thiophene dioxide moiety of formula (8), a cyclopentadithiophene dioxide moiety of formula (9), a cyclopentadithiophene tetraoxide moiety of formula (10), a thienothiophene moiety of formula (11), a thienothiophene tetraoxide moiety of formula (12), a dithienothiophene moiety of formula (13), a dithienothiophene dioxide moiety of formula (14), a dithienothiophene tetraoxide moiety of formula (15), a tetrahydroisoindole moiety of formula (16), a thienothiophene dioxide moiety of formula (17), a dithienothiophene dioxide moiety of formula (18), a fluorene moiety of formula (19), a silole moiety of formula (20), a cyclopentadithiophene moiety of formula (21), a fluorenone moiety of formula (22), a thiazole moiety of formula (23), a selenophene moiety of formula (24), a thiazolothiazole moiety of formula (25), a naphthothiadiazole moiety of formula (26), a thienopyrazine moiety of formula (27), a silacyclopentadithiophene moiety of formula (28), a thiophene moiety of formula (29), an oxazole moiety of formula (30), an imidazole moiety of formula (31), a pyrimidine moiety of formula (32), a benzoxazole moiety of formula (33), or a benzimidazole moiety of formula (34):

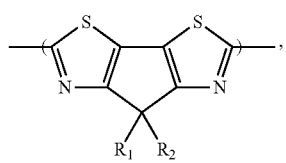

(1)

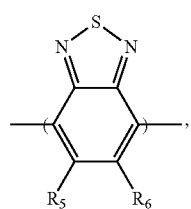

(2)

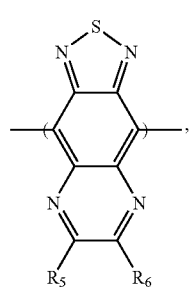

(3)

-continued

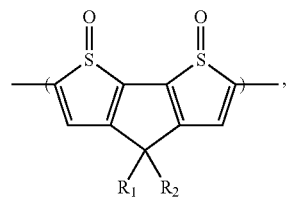

(4)

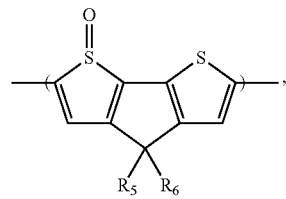

(5)

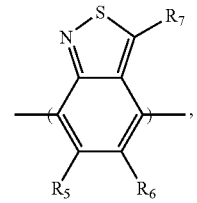

(6)

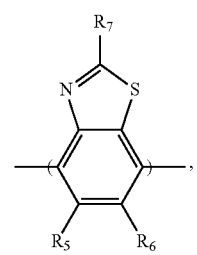

(7)

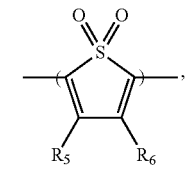

(8)

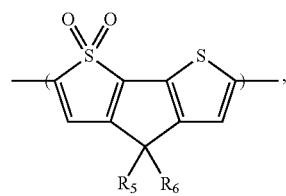

(9)

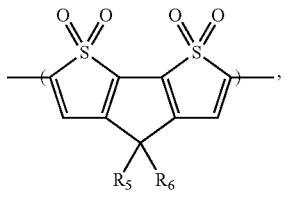

(10)

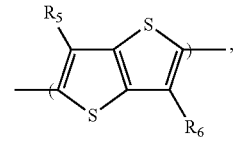

(11)

-continued
(12) 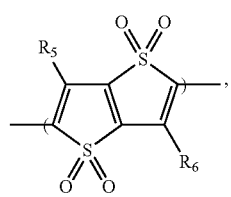
(13) 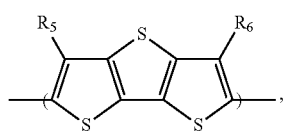
(14) 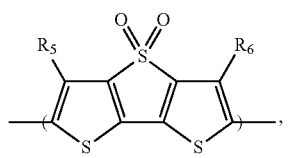
(15) 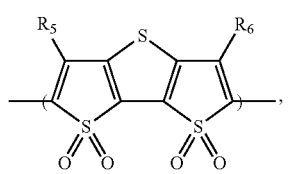
(16) 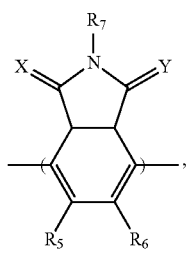
(17) 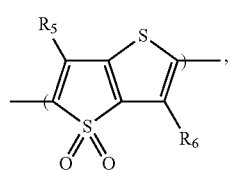
(18) 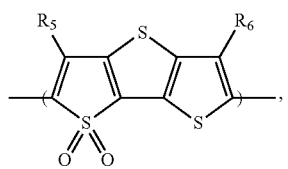
(19) 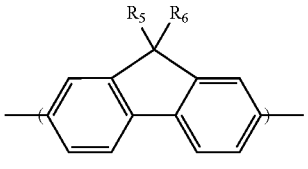
(20) 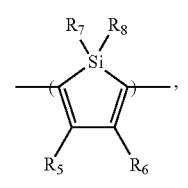
-continued
(21) 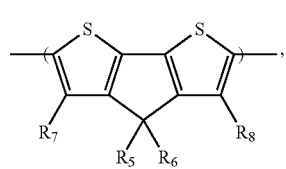
(22) 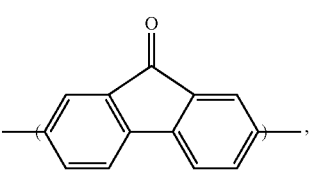
(23) 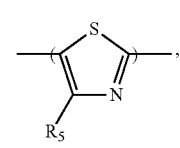
(24) 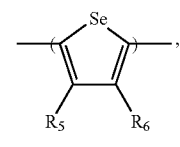
(25) 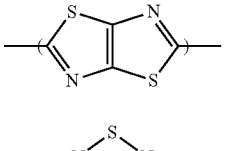
(26) 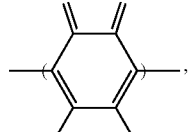
(27) 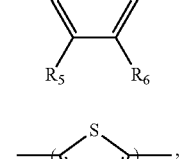
(28) 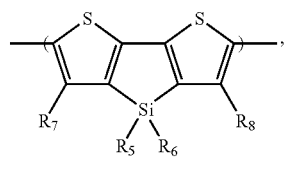
(29) 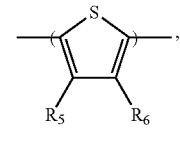

-continued

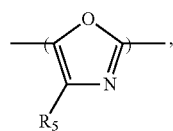
(30)

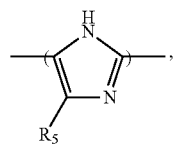
(31)

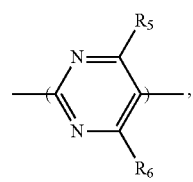
(32)

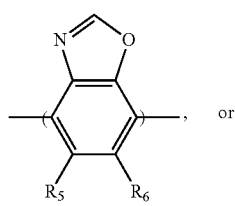
(33)
, or

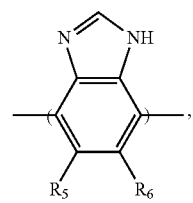
(34)

in which each of X and Y, independently, is CH$_2$, O, or S; each of R$_5$ and R$_6$, independently, is H, C$_1$-C$_{20}$ alkyl, C$_1$-C$_{20}$ alkoxy, C$_3$-C$_{20}$ cycloalkyl, C$_1$-C$_{20}$ heterocycloalkyl, aryl, heteroaryl, halo, CN, OR, C(O)R, C(O)OR, or SO$_2$R, in which R is H, C$_1$-C$_{20}$ alkyl, C$_1$-C$_{20}$ alkoxy, aryl, heteroaryl, C$_3$-C$_{20}$ cycloalkyl, or C$_1$-C$_{20}$ heterocycloalkyl; and each of R$_7$ and R$_8$, independently, is H, C$_1$-C$_{20}$ alkyl, C$_1$-C$_{20}$ alkoxy, aryl, heteroaryl, C$_3$-C$_{20}$ cycloalkyl, or C$_3$-C$_{20}$ heterocycloalkyl.

In some embodiments, the polymer further includes a third comonomer repeat unit different from the first and second comonomer repeat units. The third comonomer repeat unit can include a thiophene moiety (e.g., a unsubstituted or substituted thiophene moiety).

In some embodiments, the polymer can be either an electron donor material or an electron acceptor material.

In some embodiments, the polymer can be

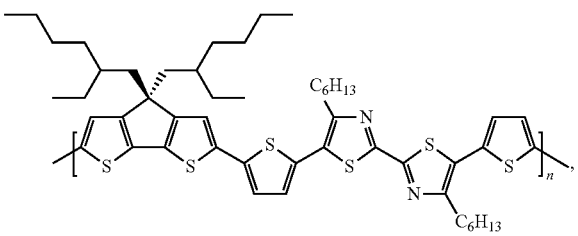

in which n can be an integer greater than 1.

In some embodiments, the photovoltaic cell can be a tandem photovoltaic cell.

In some embodiments, the photoactive material can include an electron acceptor material. In some embodiments, the electron acceptor material can be a fullerene (e.g., C61-phenyl-butyric acid methyl ester, PCBM).

In some embodiments, the polymer and the electron acceptor material each can have a LUMO energy level. The LUMO energy level of the polymer can be at least about 0.2 eV (e.g., at least about 0.3 eV) less negative than the LUMO energy level of the electron acceptor material.

In some embodiments, the device can be an organic semiconductive device. In certain embodiments, the device can be a member selected from the group consisting of field effect transistors, photodetectors, photovoltaic detectors, imaging devices, light emitting diodes, lasing devices, conversion layers, amplifiers and emitters, storage elements, and electrochromic devices.

Embodiments can provide one or more of the following advantages.

In some embodiments, using a polymer containing a thiazole moiety can be advantageous because the thiazole moiety can contribute to a shift in the maximum absorption wavelength toward the red or near IR region of the electromagnetic spectrum. When such a polymer is incorporated into a photovoltaic cell, the current and efficiency of the cell can increase.

In some embodiments, substituted fullerenes or polymers containing substituted monomer repeat units (e.g., substituted with long-chain alkoxy groups such as oligomeric ethylene oxides or fluorinated alkoxy groups) can have improved solubility in organic solvents and can form a photoactive layer with improved morphology.

In some embodiments, a polymer containing a thiazole moiety can absorb light at a relatively long wavelength and have improved solubility in organic solvents. In some embodiments, a polymer containing a thiazole moiety can be used to prepare an electron donor material with improved semiconductive properties.

In some embodiments, a photovoltaic cell containing a polymer described above can have a band gap that is relatively ideal for its intended purposes.

In some embodiments, a photovoltaic cell having high cell voltage can be created, whereby the HOMO level of the polymer is at least about 0.2 electron volts more negative relative to the LUMO or conduction band of an electron acceptor material.

In some embodiments, a photovoltaic cell containing a polymer described above can have relatively fast and efficient transfer of an electron to an electron acceptor material, whereby the LUMO of the donor is at least about 0.2 electron volt (e.g., at least about 0.3 electron volt) less negative than the conduction band of the electron acceptor material.

In some embodiments, a photovoltaic cell containing a polymer described above can have relatively fast charge separation, whereby the charge mobility of the positive charge, or hole, is relatively high and falls within the range of $10^{-4}$ to $10^{-1}$ cm$^2$/Vs.

In some embodiments, the polymer is soluble in an organic solvent and/or film forming.

In some embodiments, the polymer is optically non-scattering.

In some embodiments, the polymer can be used in organic field effect transistors and OLEDs.

Other features and advantages of the invention will be apparent from the description, drawings, and claims.

DESCRIPTION OF DRAWINGS

Like reference symbols in the various drawings indicate like elements.

DETAILED DESCRIPTION

Figure 1:
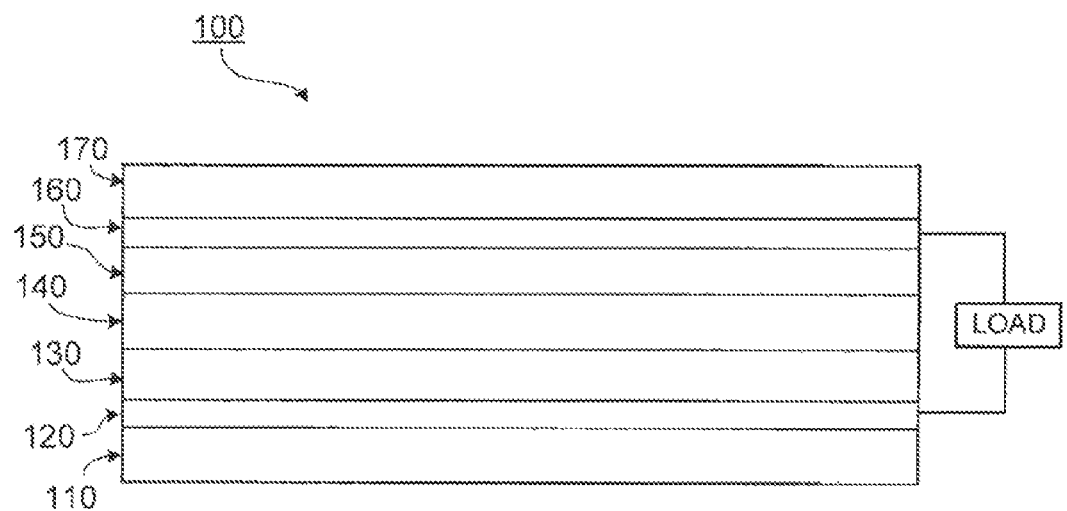
FIG. 1 is a cross-sectional view of an embodiment of a photovoltaic cell.

FIG. 1 shows a cross-sectional view of a photovoltaic cell 100 that includes a substrate 110, a cathode 120, a hole carrier layer 130, an active layer 140 (containing an electron acceptor material and an electron donor material), a hole blocking layer 150, an anode 160, and a substrate 170.

In general, during use, light impinges on the surface of substrate 110, and passes through substrate 110, cathode 120, and hole carrier layer 130. The light then interacts with active layer 140, causing electrons to be transferred from the electron donor material (e.g., a polymer described above) to the electron acceptor material (e.g., PCBM). The electron acceptor material then transmits the electrons through hole blocking layer 150 to anode 160, and the electron donor material transfers holes through hole carrier layer 130 to cathode 120. Anode 160 and cathode 120 are in electrical connection via an external load so that electrons pass from anode 160, through the load, and to cathode 120.

Electron acceptor materials of active layer 140 can include fullerenes. In some embodiments, active layer 140 can include one or more unsubstituted fullerenes and/or one or more substituted fullerenes. Examples of unsubstituted fullerenes include $C_{60}$, $C_{70}$, $C_{76}$, $C_{78}$, $C_{82}$, $C_{84}$, and $C_{92}$. Examples of substituted fullerenes include PCBM or fullerenes substituted with $C_1$-$C_{20}$ alkoxy optionally further substituted with $C_1$-$C_{20}$ alkoxy or halo (e.g., (OCH$_2$CH$_2$)$_2$OCH$_3$ or OCH$_2$CF$_2$OCF$_2$CF$_2$OCF$_3$). Without wishing to be bound by theory, it is believed that fullerenes substituted with long-chain alkoxy groups (e.g., oligomeric ethylene oxides) or fluorinated alkoxy groups have improved solubility in organic solvents and can form a photoactive layer with improved morphology.

In some embodiments, the electron acceptor materials can include polymers (e.g., homopolymers or copolymers). A polymers mentioned herein include at least two identical or different monomer repeat units (e.g., at least 5 monomer repeat units, at least 10 monomer repeat units, at least 50 monomer repeat units, at least 100 monomer repeat units, or at least 500 monomer repeat units). A copolymer mentioned herein refers to a polymer that includes at least two co-monomers of differing structures. In some embodiments, the polymers used as an electron acceptor material can include one or more monomer repeat units listed in Tables 1 and 2 below.

Specifically, Table 1 lists examples of electron donating monomer repeat units that can serve as a conjugative link. Table 2 lists examples of electron withdrawing monomer repeat units. Note that depending on the substituents, monomer repeat units listed in Table 1 can be electron withdrawing and monomer repeat units listed in Table 2 can also be electron donating. Preferably, the polymers used as an electron acceptor material include a high molar percentage (e.g., at least about 50%, at least about 60%, at least about 70%, at least about 80%, at least about 90%) of an electron withdrawing monomer repeat unit.

Electron donor materials of active layer 140 can include polymers (e.g., homopolymers or copolymers). In some embodiments, the polymers used as an electron donor material can include one or more monomer repeat units listed in Tables 1 and 2. Preferably, the polymers used as an electron donor material include a high molar percentage (e.g., at least about 50%, at least about 60%, at least about 70%, at least about 80%, at least about 90%) of an electron donating monomer repeat unit. In some embodiments, the polymers include a monomer repeat unit containing $C_1$-$C_{20}$ alkoxy on a ring, which is optionally further substituted with $C_1$-$C_{20}$ alkoxy or halo (e.g., (OCH$_2$CH$_2$)$_2$OCH$_3$ or OCH$_2$CF$_2$OCF$_2$CF$_2$OCF$_3$). Without wishing to be bound by theory, it is believed that polymers containing monomer repeat units substituted with long-chain alkoxy groups (e.g., oligomeric ethylene oxides) or fluorinated alkoxy groups have improved solubility in organic solvents and can form an photoactive layer with improved morphology.

TABLE 1

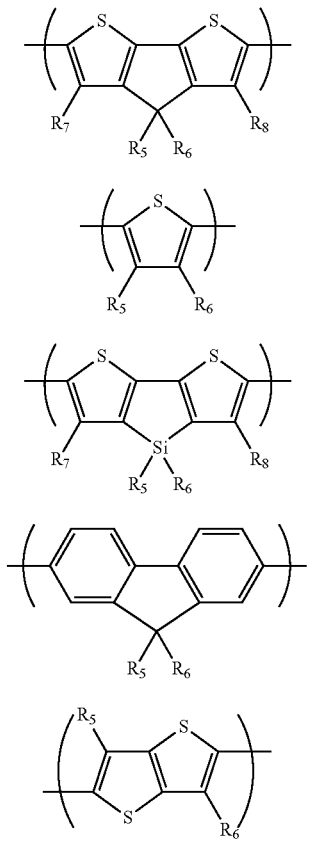

TABLE 1-continued
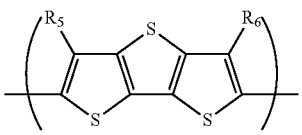
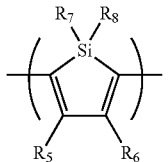
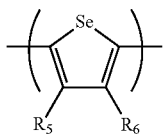
TABLE 2
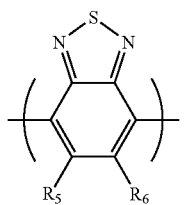
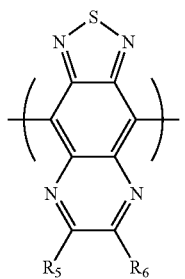
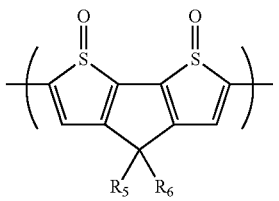
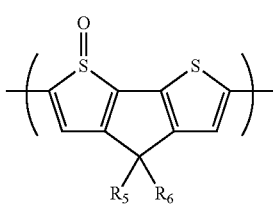
TABLE 2-continued
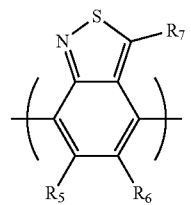
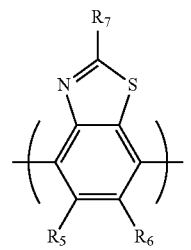
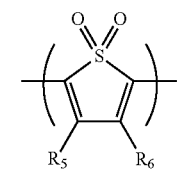
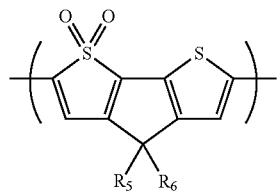
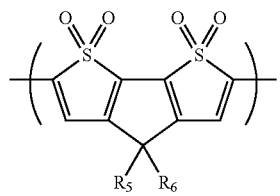
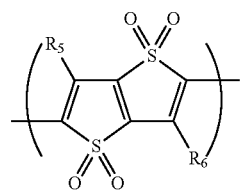
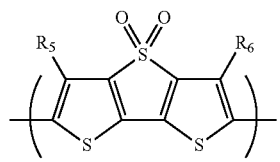
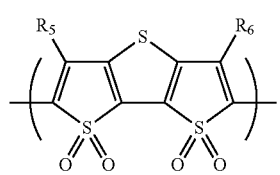

TABLE 2-continued

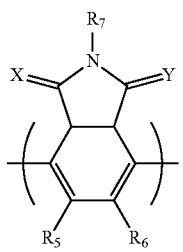
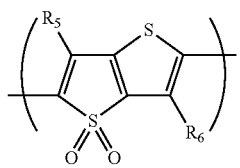
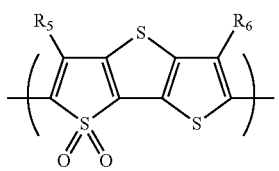
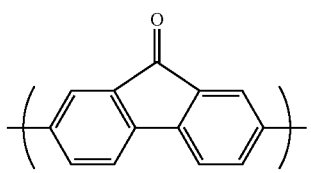
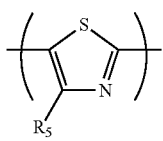
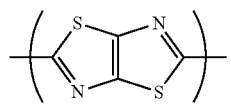
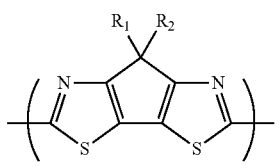
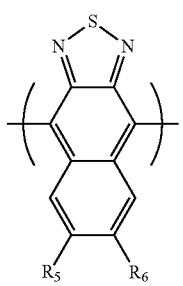

TABLE 2-continued

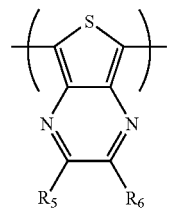

Referring to formulas listed in Tables 1 and 2 above, each of X and Y, independently, can be $CH_2$, O, or S; each of $R_1$, $R_2$, $R_5$, and $R_6$, independently, can be H, $C_1$-$C_{20}$ alkyl (e.g., branched alkyl or perflorinated alkyl), $C_1$-$C_{20}$ alkoxy, $C_3$-$C_{20}$ cycloalkyl, $C_1$-$C_{20}$ heterocycloalkyl, aryl (e.g., phenyl or substituted phenyl), heteroaryl, halo, CN, OR, C(O)R, C(O)OR, or $SO_2R$; R being H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl; and each of $R_7$ and $R_8$, independently, is H, $C_1$-$C_{20}$ alkyl, $C_1$-$C_{20}$ alkoxy, aryl, heteroaryl, $C_3$-$C_{20}$ cycloalkyl, or $C_3$-$C_{20}$ heterocycloalkyl.

An alkyl can be saturated or unsaturated and branch or straight chained. A $C_1$-$C_{20}$ alkyl contains 1 to 20 carbon atoms (e.g., one, two, three, four, five, six, seven, eight, nine, 10, 11, 12, 13, 14, 15, 16, 17, 18, 19, and 20 carbon atoms). Examples of alkyl moieties include —$CH_3$, —$CH_2$—, —$CH_2$=$CH_2$—, —$CH_2$—CH=$CH_2$, and branched —$C_3H_7$. An alkoxy can be branch or straight chained and saturated or unsaturated. A $C_1$-$C_{20}$ alkoxy contains an oxygen radical and 1 to 20 carbon atoms (e.g., one, two, three, four, five, six, seven, eight, nine, 10, 11, 12, 13, 14, 15, 16, 17, 18, 19, and 20 carbon atoms). Examples of alkoxy moieties include —$OCH_3$ and —OCH=CH—$CH_3$. A cycloalkyl can be either saturated or unsaturated. A $C_3$-$C_{20}$ cycloalkyl contains 3 to 20 carbon atoms (e.g., three, four, five, six, seven, eight, nine, 10, 11, 12, 13, 14, 15, 16, 17, 18, 19, and 20 carbon atoms). Examples of cycloalkyl moieities include cyclohexyl and cyclohexen-3-yl. A heterocycloalkyl can also be either saturated or unsaturated. A $C_3$-$C_{20}$ heterocycloalkyl contains at least one ring heteroatom (e.g., O, N, and S) and 3 to 20 carbon atoms (e.g., three, four, five, six, seven, eight, nine, 10, 11, 12, 13, 14, 15, 16, 17, 18, 19, and 20 carbon atoms). Examples of heterocycloalkyl moieties include 4-tetrahydropyranyl and 4-pyranyl. An aryl can contain one or more aromatic rings. Examples of aryl moieties include phenyl, phenylene, naphthyl, naphthylene, pyrenyl, anthryl, and phenanthryl. A heteroaryl can contain one or more aromatic rings, at least one of which contains at least one ring heteroatom (e.g., O, N, and S). Examples of heteroaryl moieties include furyl, furylene, fluorenyl, pyrrolyl, thienyl, oxazolyl, imidazolyl, thiazolyl, pyridyl, pyrimidinyl, quinazolinyl, quinolyl, isoquinolyl, and indolyl.

Alkyl, alkoxy, cycloalkyl, heterocycloalkyl, aryl, and heteroaryl mentioned herein include both substituted and unsubstituted moieties, unless specified otherwise. Examples of substituents on cycloalkyl, heterocycloalkyl, aryl, and heteroaryl include $C_1$-$C_{20}$ alkyl, $C_3$-$C_{20}$ cycloalkyl, $C_1$-$C_{20}$ alkoxy, aryl, aryloxy, heteroaryl, heteroaryloxy, amino, $C_1$-$C_{10}$ alkylamino, $C_1$-$C_{20}$ dialkylamino, arylamino, diarylamino, hydroxyl, halogen, thio, $C_1$-$C_{10}$ alkylthio, arylthio, $C_1$-$C_{10}$ alkylsulfonyl, arylsulfonyl, cyano, nitro, acyl, acyloxy, carboxyl, and carboxylic ester. Examples of substituents on alkyl include all of the above-recited substituents except $C_1$-$C_{20}$ alkyl. Cycloalkyl, heterocycloalkyl, aryl, and heteroaryl also include fused groups.

The monomers for preparing the polymers mentioned herein may contain a non-aromatic double bond and one or more asymmetric centers. Thus, they can occur as racemates and racemic mixtures, single enantiomers, individual diastereomers, diastereomeric mixtures, and cis- or trans-isomeric forms. All such isomeric forms are contemplated.

The copolymers described above can be prepared by methods known in the art. For example, a copolymer can be prepared by a cross-coupling reaction between one or more comonomers containing two alkylstannyl groups and one or more comonomers containing two halo groups in the presence of a transition metal catalyst. As another example, a copolymer can be prepared by a cross-coupling reaction between one or more comonomers containing two borate groups and one or more comonomers containing two halo groups in the presence of a transition metal catalyst. The comonomers can be prepared by the methods described herein or by the methods know in the art, such as those described in U.S. patent application Ser. No. 11/486,536, Coppo et al., Macromolecules 2003, 36, 2705-2711 and Kurt et al., *J. Heterocycl. Chem.* 1970, 6, 629, the contents of which are hereby incorporated by reference.

The monomers for preparing the copolymers described above are either commercially available or can be prepared by methods known in the art. For example, a cyclopentadithiazole monomer can be prepared by the method illustrated in Scheme I below. The cyclopentadithiazole monomer thus obtained can then react with another monomer (such as those shown in Scheme II below) to form a copolymer described above.

Scheme I

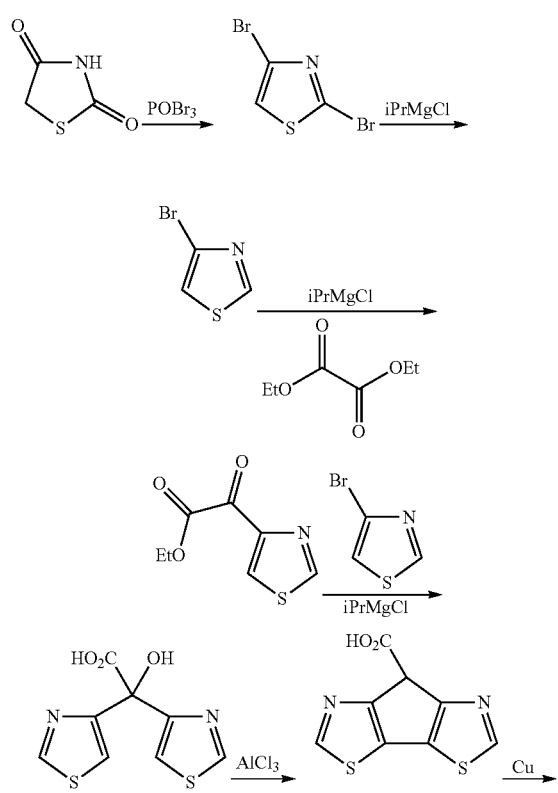

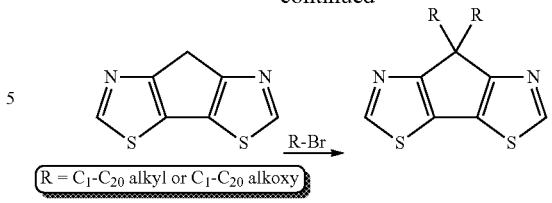

Scheme II

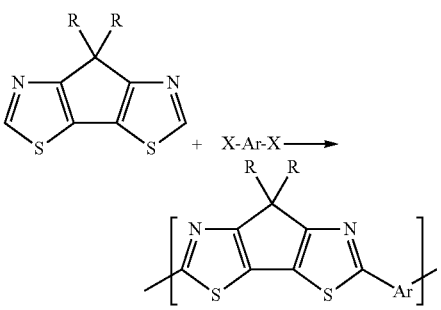

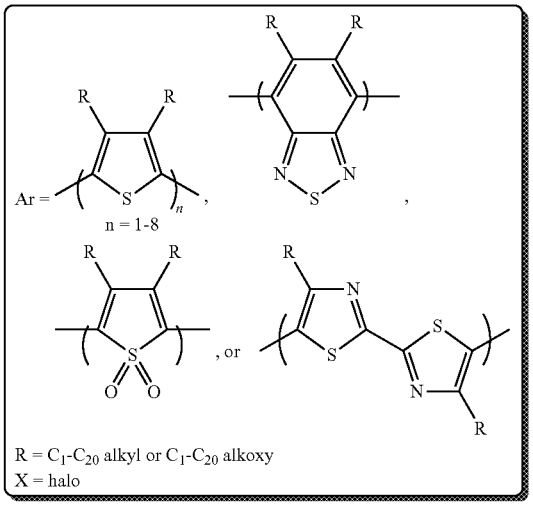

Table 3 below lists an exemplary polymer (i.e., polymer 1) described in the Summary section above. This polymer can have unique properties, which make it particularly suitable as a charge carrier in the active layer of a photovoltaic cell. For example, an organic photovoltaic cell include this polymer in the active layer can have an efficiency more than 3%. Polymer 1 can be obtained by the methods described in Example 2 below.

Polymer 1

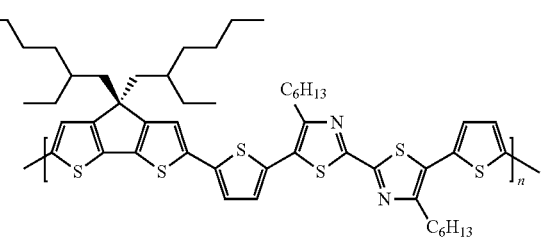

Generally, one co-monomer in the polymers described in the Summary section above contains a thiazole moiety (e.g., a bithiazole, thiazolothiazole, or cyclopentadithiazole moiety). An advantage of a co-polymer containing a thiazole moiety is that its absorption wavelength can shift toward the red and near IR portion (e.g., 650-800 nm) of the electromagnetic spectrum, which is not accessible by most other polymers. When such a co-polymer is incorporated into a photovoltaic cell, it enables the cell to absorb the light in this region of the spectrum, thereby increasing the current and efficiency of the cell.

The polymers described above can be useful in solar power technology because the band gap is close to ideal for a photovoltaic cell (e.g., a polymer-fullerene cell). The HOMO level of the polymers can be positioned correctly relative to the LUMO of an electron acceptor (e.g., PCBM) in a photovoltaic cell (e.g., a polymer-fullerene cell), allowing for high cell voltage. The LUMO of the polymers can be positioned correctly relative to the conduction band of the electron acceptor in a photovoltaic cell, thereby creating efficient transfer of an electron to the electron acceptor. For example, using a polymer having a band gap of about 1.4-1.6 eV can significantly enhance cell voltage. Cell performance, specifically efficiency, can benefit from both an increase in photocurrent and an increase in cell voltage, and can approach and even exceed 15% efficiency. The positive charge mobility of the polymers can be relatively high and approximately in the range of $10^{-4}$ to $10^{-1}$ cm$^2$/Vs. In general, the relatively high positive charge mobility allows for relatively fast charge separation. The polymers can also be soluble in an organic solvent and/or film forming. Further, the polymers can be optically non-scattering.

Components in photovoltaic cell other than the electron acceptor materials and the electron donor materials are known in the art, such as those described in U.S. patent application Ser. No. 10/723,554, the contents of which are incorporated herein by references.

In some embodiments, the polymer described above can be used as an electron donor material or an electro acceptor material in a system in which two photovoltaic cells share a common electrode. Such a system is also known as tandem photovoltaic cell. Examples of tandem photovoltaic cells are discussed in U.S. patent application Ser. No. 10/558,878, filed Nov. 29, 2005, the contents of which are hereby incorporated by reference.

Figure 2:
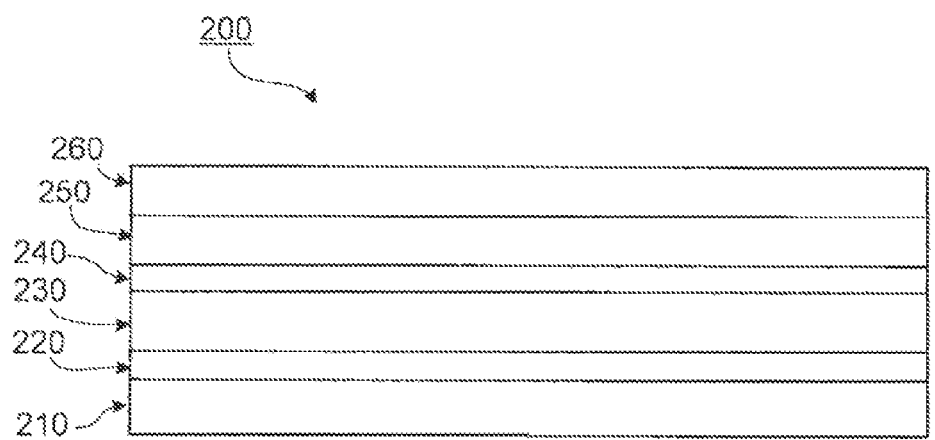
FIG. 2 is a schematic of a system containing one electrode between two photoactive layers.

As an example, FIG. 2 is a schematic of a tandem photovoltaic cell 200 having a substrate 210, three electrodes 220, 240, and 260, and two photoactive layers 230 and 250. Electrode 240 is shared between photoactive layers 230 and 250, and is electrically connected with electrodes 220 and 260. In general, electrodes 220, 240, and 260 can be formed of an electrically conductive material, such as those described in U.S. patent application Ser. No. 10/723,554. In some embodiments, one or more (i.e., one, two, or three) electrodes 220, 240, and 260 is a mesh electrode. In some embodiments, one or more electrodes 220, 240, and 260 is formed of a semiconductive material. Examples of semiconductive materials include titanium oxides, indium tin oxides, fluorinated tin oxides, tin oxides, and zinc oxides. In certain embodiments, one or more (i.e., one, two, or three) electrodes 220, 240, and 260 are formed of titanium dioxide. Titanium dioxide used to prepare an electrode can be in any suitable forms. For example, titanium dioxide can be in the form of interconnected nanoparticles. Examples of interconnected titanium dioxide nanoparticles are described, for example, in U.S. Pat. No. 7,022,910, the contents of which are incorporated herein by reference. In some embodiments, at least one (e.g., one, two, or three) of electrodes 220, 240, and 260 is a transparent electrode. As referred to herein, a transparent electrode is formed of a material which, at the thickness used in a photovoltaic cell, transmits at least about 60% (e.g., at least about 70%, at least about 75%, at least about 80%, at least about 85%, at least about 90%, at least about 95%) of incident light at a wavelength or a range of wavelengths used during operation of the photovoltaic cell. In certain embodiments, both electrodes 220 and 260 are transparent electrodes.

Each of photoactive layers 230 and 250 can contain at least one semiconductive material. In some embodiments, the semiconductive material in photoactive layer 230 has the same band gap as the semiconductive material in photoactive layer 250. In certain embodiments, the semiconductive material in photoactive layer 230 has a band gap different from that of the semiconductive material in photoactive layer 250. Without wishing to be bound by theory, it is believed that incident light not absorbed by one photoactive layer can be absorbed by the other photoactive layer, thereby maximizing the absorption of the incident light.

In some embodiments, at least one of photoactive layers 230 and 250 can contain an electron acceptor material (e.g., PCBM or a polymer described above) and an electron donor material (e.g., a polymer described above). In general, suitable electron acceptor materials and electron donor materials can be those described above. In certain embodiments, each of photoactive layers 230 and 250 contains an electron acceptor material and an electron donor material.

Substrate 210 can be formed of one or more suitable polymers, such as those described in U.S. patent application Ser. No. 10/723,554. In some embodiments, an additional substrate (not shown in FIG. 2) can be disposed on electrode 260.

Photovoltaic cell 200 can further contain a hole carrier layer (not shown in FIG. 2) and a hole blocking layer (not shown in FIG. 2), such as those described in U.S. patent application Ser. No. 10/723,554.

While photovoltaic cells have been described above, in some embodiments, the polymers described herein can be used in other devices and systems. For example, the polymers can be used in suitable organic semiconductive devices, such as field effect transistors, photodetectors (e.g., IR detectors), photovoltaic detectors, imaging devices (e.g., RGB imaging devices for cameras or medical imaging systems), light emitting diodes (LEDs) (e.g., organic LEDs or IR or near IR LEDs), lasing devices, conversion layers (e.g., layers that convert visible emission into IR emission), amplifiers and emitters for telecommunication (e.g., dopants for fibers), storage elements (e.g., holographic storage elements), and electrochromic devices (e.g., electrochromic displays).

The following examples are illustrative and not intended to be limiting.

EXAMPLE 1

Preparation of 2,6-bis(4,4,5,5-tetramethyl-1,3,2-dioxaborolan-2-yl)-4H-4,4-bis(2'-ethylhexyl)cyclopenta[2,1-b:3,4-b']thiophene

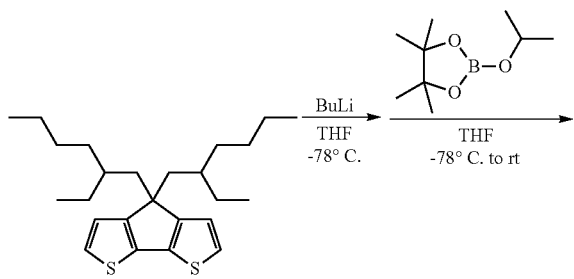

100 mL oven dried Schlenk flask was charged with 1.097 g (2.72 mmol) of 4H-4,4-bis(2'-ethylhexyl)cyclopenta[2,1-b:3,4-b']dithiophene. The flask was evacuated and purged with argon three times. To this flask was then added 20 mL of dry, distilled THF. The resulting solution was cooled to −78° C. and 4.35 mL (10.88 mmol, 4 equv.) of 2.5M BuLi was added dropwise. The reaction was stirred for 1 hout at −78° C. and then warmed to room temperature and stirred for an additional 3 hours. The solution was cooled again to −78° C. and 2.77 mL (13.6 mmol, 5 equiv.) of 2-isopropoxy-4,4,5,5-tetramethyl-1,3,2-dioxaborolane was added in one portion via syringe. The reaction was stirred at −78° C. for 1 hour and then allowed to warm to room temperature overnight. The solution was poured into water and extracted with 4×150 mL of methyl tert-butyl ether. The organic layers were combined and washed with 2×150 mL of brine, dried with anhydrous $MgSO_4$, and filtered. The solvent was removed under vacuum to yield and orange oil, which was purified by column chromatography (5% EtOAc in hexanes) to yield a colorless, viscous oil, 1.34 g (75% yield).

EXAMPLE 2

Preparation of Polymer 1

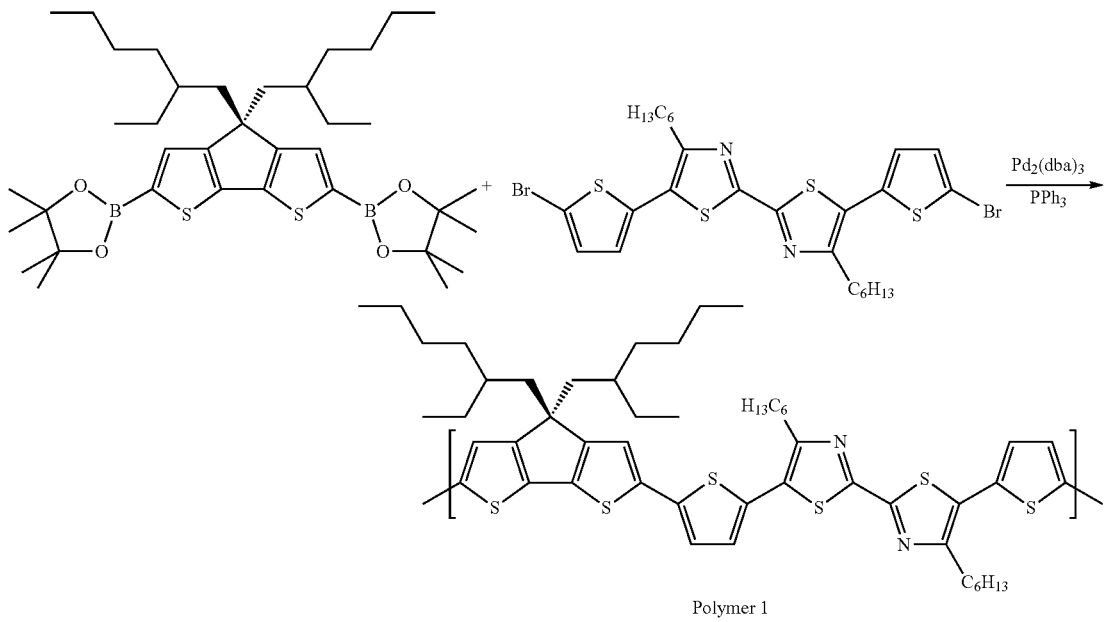

Polymer 1

A 100 mL Schlenk flask was charged with 0.1515 g (0.231 mmol) of 2,6-bis(4,4,5,5-tetramethyl-1,3,2-dioxaborolan-2-yl)-4H-4,4-bis(2'-ethylhexyl)cyclopenta[2,1-b:3,4-b']thiophene, 0.152 g (0.231 mmol) of 5,5'-bis(5-bromo-2-thienyl)-4,4'-dihexyl-2,2'-bithiazole, 2.1 mg $Pd_2\ dba_3$ (0.00231 mmol), 4.2 mg $PPh_3$ (0.0162 mmol), and 35 mg (0.0855 mmol) of Aliquat 336. The flask, which was fitted with a condenser, was then evacuated and refilled with argon three times. The reagents were dissolved in a mixture of 20 mL of THF and 15 mL of toluene. 2 mL of a 2M $Na_2CO_3$ aqueous solution was added to the above solution while stirring. The reaction was heated at 90° C. for 3 days. A 1 mL THF solution of 14 mg (0.1155 mmol) of phenylboronic acid and 1.6 mg (0.00231 mmol) of $PdCl_2(PPh_3)_2$ was added. Heating was continued for an additional 24 hours. After the reaction was then cooled to 80° C., 10 mL of a 7.5% sodium diethyldithiocarbamate solution in water was added. The mixture was heated at 80° C. with stirring for 18 hours. After the reaction was cooled, the organic layer was separated and washed with warm water (3×100 mL). The toluene solution was concentrated and then poured into 750 mL of stirring MeOH. After the solution was filtered, the dark precipitate was collected and washed with MeOH. The precipitate was then transferred to a Soxhlet thimble and washed with acetone overnight. The product thus obtained was dried under vacuum to give 0.176 g of brown solid (0.195 mmol, 84%). $^1$H NMR (200 MHz, CDCl$_3$): δ 7.2-7.1 (br, 6H), 3.0 (m, 4H), 1.86 (m, 8H), 1.6 (br, 16H), 1.20-0.65 (br, 32H).

Other embodiments are in the claims.

What is claimed is:

1. An article, comprising:
   a first electrode;
   a second electrode; and
   a photoactive material disposed between the first and second electrodes, the photoactive material comprising a polymer including a first comonomer repeat unit and a second comonomer repeat unit different from the first comonomer repeat unit;
   wherein the first comonomer repeat unit comprises a thiazole moiety; the second comonomer repeat unit is not a thiophene moiety or a fluorene moiety; and the article is configured as a photovoltaic cell.

2. The article of claim 1, wherein the first comonomer repeat unit comprises a thiazole moiety of formula (23):

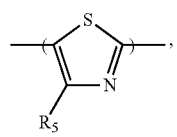

(23)

wherein R$_5$ is H, C$_1$-C$_{20}$ alkyl, C$_1$-C$_{20}$ alkoxy, C$_3$-C$_{20}$ cycloalkyl, C$_1$-C$_{20}$ heterocycloalkyl, aryl, heteroaryl, halo, CN, OR, C(O)R, C(O)OR, or SO$_2$R; R being H, C$_1$-C$_{20}$ alkyl, C$_1$-C$_{20}$ alkoxy, aryl, heteroaryl, C$_3$-C$_{20}$ cycloalkyl, or C$_1$-C$_{20}$ heterocycloalkyl.

3. The article of claim 2, wherein R$_5$ is C$_1$-C$_{20}$ alkoxy or C$_1$-C$_{20}$ alkyl optionally substituted with C$_1$-C$_{20}$ alkoxy or halo.

4. The article of claim 3, wherein R$_5$ is hexyl.

5. The article of claim 1, wherein the second comonomer repeat unit comprises a silacyclopentadithiophene moiety, a benzothiadiazole moiety, a thiadiazoloquinoxaline moiety, a cyclopentadithiophene moiety, a cyclopentadithiophene oxide moiety, a benzoisothiazole moiety, a benzothiazole moiety, a thiophene oxide moiety, a thienothiophene moiety, a thienothiophene oxide moiety, a dithienothiophene moiety, a dithienothiophene oxide moiety, a tetrahydroisoindole moiety, a fluorenone moiety, a thiazole moiety, a selenophene moiety, a silole moiety, a thiazolothiazole moiety, a cyclopentadithiazole moiety, a naphthothiadiazole moiety, a thienopyrazine moiety, an oxazole moiety, an imidazole moiety, a pyrimidine moiety, a benzoxazole moiety, or a benzimidazole moiety.

6. The article of claim 5, wherein the second comonomer repeat unit comprises a cyclopentadithiazole moiety of formula (1), a benzothiadiazole moiety of formula (2), a thiadiazoloquinoxaline moiety of formula (3), a cyclopentadithiophene dioxide moiety of formula (4), a cyclopentadithiophene monoxide moiety of formula (5), a benzoisothiazole moiety of formula (6), a benzothiazole moiety of formula (7), a thiophene dioxide moiety of formula (8), a cyclopentadithiophene dioxide moiety of formula (9), a cyclopentadithiophene tetraoxide moiety of formula (10), a thienothiophene moiety of formula (11), a thienothiophene tetraoxide moiety of formula (12), a dithienothiophene moiety of formula (13), a dithienothiophene dioxide moiety of formula (14), a dithienothiophene tetraoxide moiety of formula (15), a tetrahydroisoindole moiety of formula (16), a thienothiophene dioxide moiety of formula (17), a dithienothiophene dioxide moiety of formula (18), a silole moiety of formula (20), a cyclopentadithiophene moiety of formula (21), a fluorenone moiety of formula (22), a thiazole moiety of formula (23), a selenophene moiety of formula (24), a thiazolothiazole moiety of formula (25), a naphthothiadiazole moiety of formula (26), a thienopyrazine moiety of formula (27), a silacyclopentadithiophene moiety of formula (28), an oxazole moiety of formula (30), an imidazole moiety of formula (31), a pyrimidine moiety of formula (32), a benzoxazole moiety of formula (33), or a benzimidazole moiety of formula (34):

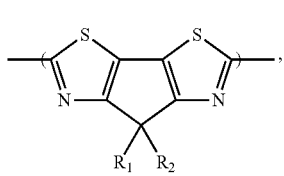

(1)

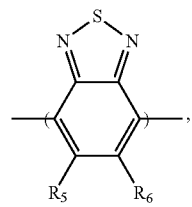

(2)

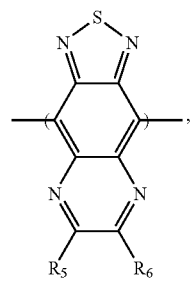

(3)

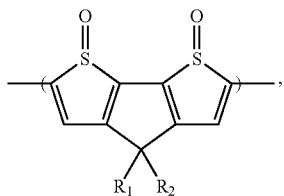

(4)

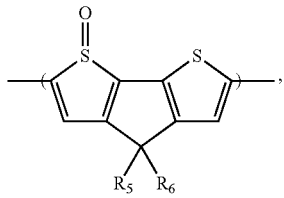

(5)

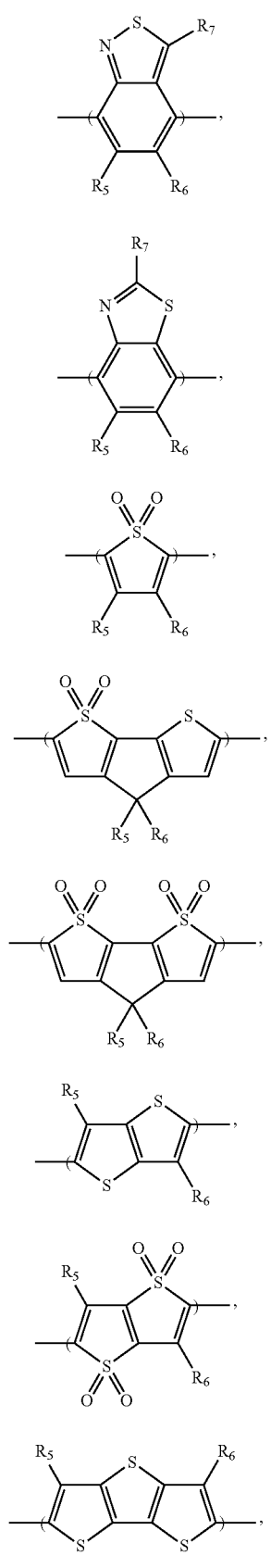
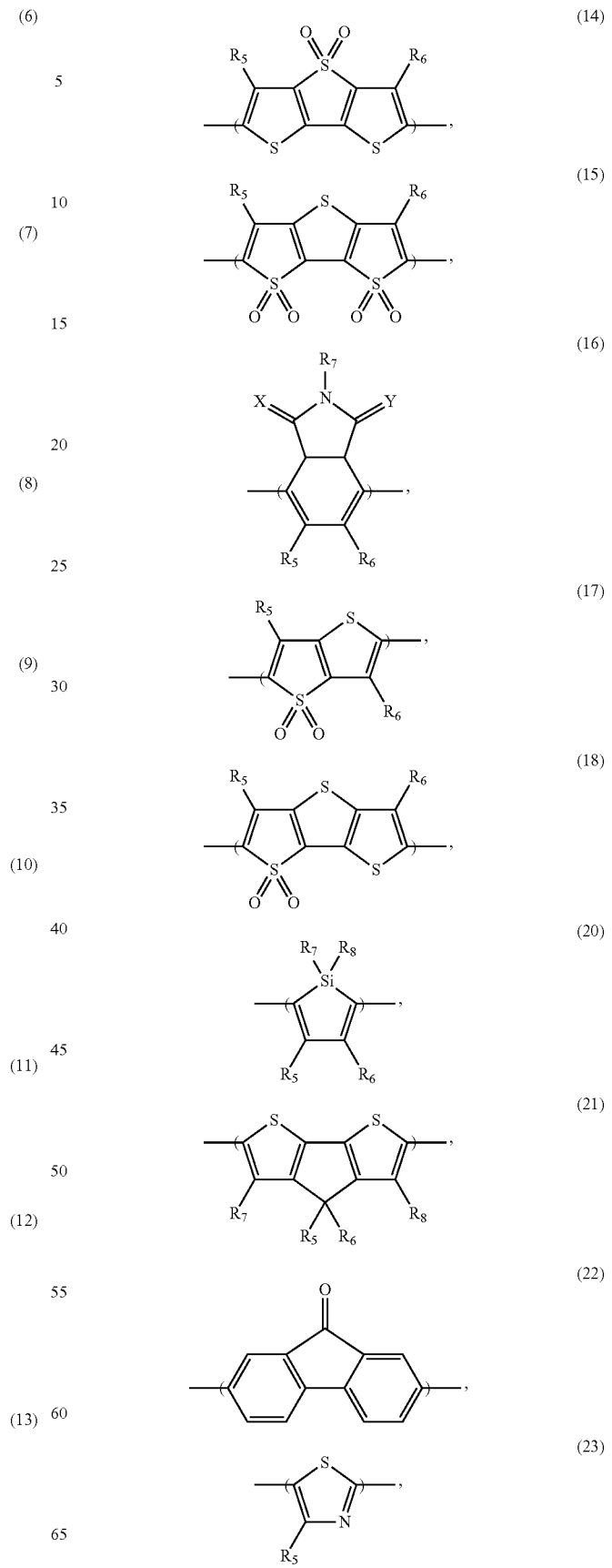

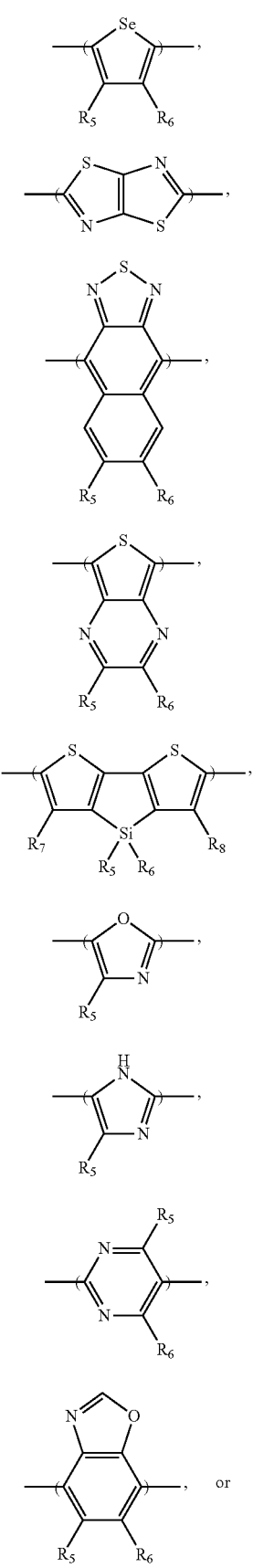

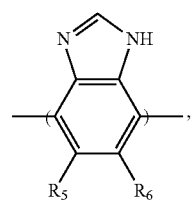

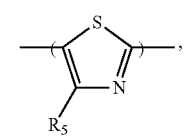

wherein
each of X and Y, independently, is $CH_2$, O, or S;
each of $R_1$, $R_2$, $R_5$ and $R_6$, independently, is H, $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, or $SO_2R$, in which R is H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl; and
each of $R_7$ and $R_8$, independently, is H, $C_1$-$C_{20}$ alkyl, $C_1$-$C_{20}$ alkoxy, aryl, heteroaryl, $C_3$-$C_{20}$ cycloalkyl, or $C_3$-$C_{20}$ heterocycloalkyl.

7. The article of claim 6, wherein the second comonomer repeat unit comprises the cyclopentadithiazole moiety of formula (1), the cyclopentadithiophene moiety of formula (21), or the silacyclopentadithiophene moiety of formula (28).

8. The article of claim 1, further comprising a third comomoner repeat unit different from the first and second comonomer repeat units.

9. The article of claim 8, wherein the third comomoner repeat unit comprises a thiophene moiety.

10. A polymer, comprising:
a first comonomer repeat unit comprising a thiazole moiety; and
a second comonomer repeat unit different from the first comonomer repeat unit, the second comonomer repeat unit not being a thiophene moiety or a fluorene moiety.

11. The polymer of claim 10, wherein the first comonomer repeat unit comprises a thiazole moiety of formula (23):

(23)

wherein $R_5$ is H, $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, or $SO_2R$; R being H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl.

12. The polymer of claim 11, wherein $R_5$ is $C_1$-$C_{20}$ alkoxy or $C_1$-$C_{20}$ alkyl optionally substituted with $C_1$-$C_{20}$ alkoxy or halo.

13. The polymer of claim 12, wherein $R_5$ is hexyl.

14. The polymer of claim 10, wherein the second comonomer repeat unit comprises a silacyclopentadithiophene moiety, a benzothiadiazole moiety, a thiadiazoloquinoxaline moiety, a cyclopentadithiophene moiety, a cyclopentadithiophene oxide moiety, a benzoisothiazole moiety, a benzothiazole moiety, a thiophene oxide moiety, a thienothiophene moiety, a thienothiophene oxide moiety, a dithienothiophene moiety, a dithienothiophene oxide moiety, a tetrahydroisoindole moiety, a fluorenone moiety, a thiazole moiety, a selenophene moiety, a silole moiety, a thiazolothiazole moiety, a cyclopentadithiazole moiety, a naphthothiadiazole moiety, a thienopyrazine moiety, an oxazole moiety, an imidazole moiety, a pyrimidine moiety, a benzoxazole moiety, or a benzimidazole moiety.

15. The polymer of claim 14, wherein the second comonomer repeat unit comprises a cyclopentadithiazole moiety of formula (1), a benzothiadiazole moiety of formula (2), a thiadiazoloquinoxaline moiety of formula (3), a cyclopentadithiophene dioxide moiety of formula (4), a cyclopentadithiophene monoxide moiety of formula (5), a benzoisothiazole moiety of formula (6), a benzothiazole moiety of formula (7), a thiophene dioxide moiety of formula (8), a cyclopentadithiophene dioxide moiety of formula (9), a cyclopentadithiophene tetraoxide moiety of formula (10), a thienothiophene moiety of formula (11), a thienothiophene tetraoxide moiety of formula (12), a dithienothiophene moiety of formula (13), a dithienothiophene dioxide moiety of formula (14), a dithienothiophene tetraoxide moiety of formula (15), a tetrahydroisoindole moiety of formula (16), a thienothiophene dioxide moiety of formula (17), a dithienothiophene dioxide moiety of formula (18), a silole moiety of formula (20), a cyclopentadithiophene moiety of formula (21), a fluorenone moiety of formula (22), a thiazole moiety of formula (23), a selenophene moiety of formula (24), a thiazolothiazole moiety of formula (25), a naphthothiadiazole moiety of formula (26), a thienopyrazine moiety of formula (27), a silacyclopentadithiophene moiety of formula (28), an oxazole moiety of formula (30), an imidazole moiety of formula (31), a pyrimidine moiety of formula (32), a benzoxazole moiety of formula (33), or a benzimidazole moiety of formula (34):

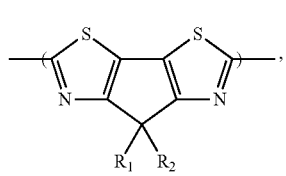
(1)

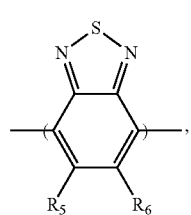
(2)

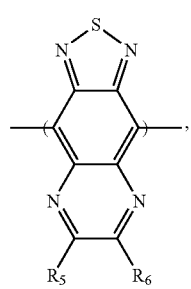
(3)

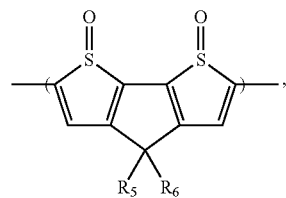
(4)

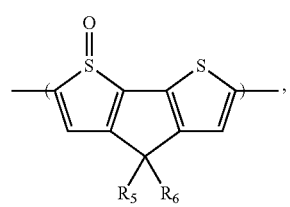
(5)

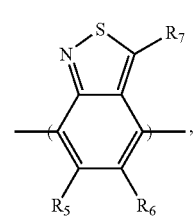
(6)

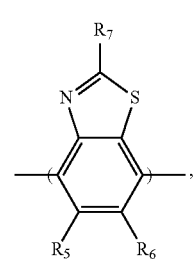
(7)

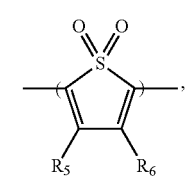
(8)

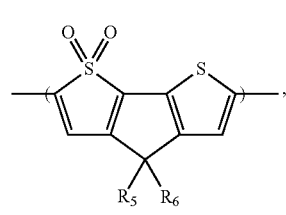
(9)

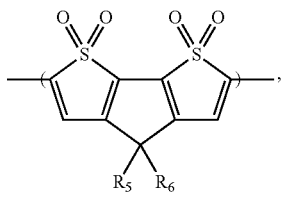
(10)

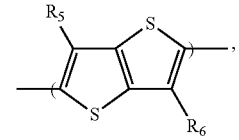
(11)

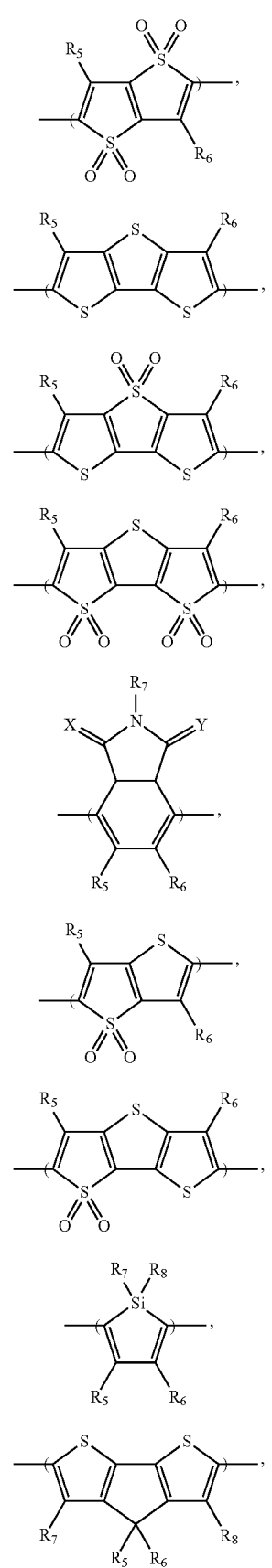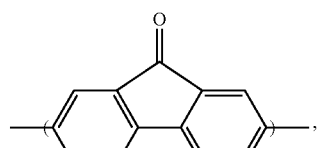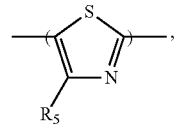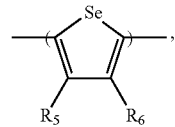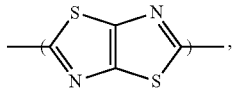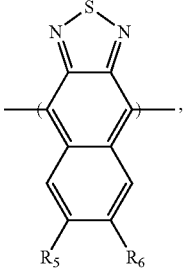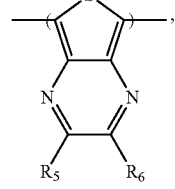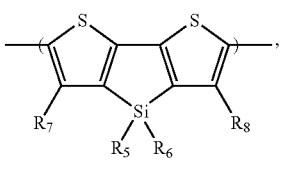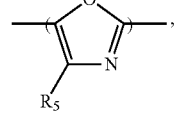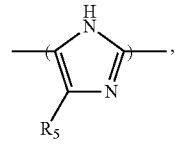

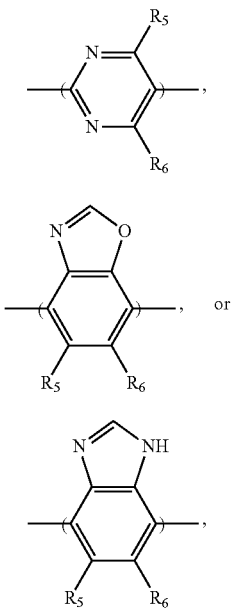

wherein each of X and Y, independently, is $CH_2$, O, or S;

each of $R_1$, $R_2$, $R_5$ and $R_6$, independently, is H, $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, or $SO_2R$, in which R is H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl; and each of $R_7$ and $R_8$, independently, is H, $C_1$-$C_{20}$ alkyl, $C_1$-$C_{20}$ alkoxy, aryl, heteroaryl, $C_3$-$C_{20}$ cycloalkyl, or $C_3$-$C_{20}$ heterocycloalkyl.

16. The polymer of claim 15, wherein the second comonomer repeat unit comprises the cyclopentadithiazole moiety of formula (1), the cyclopentadithiophene moiety of formula (21), or the silacyclopentadithiophene moiety of formula (28).

17. The polymer of claim 10, further comprising a third comomonomer repeat unit different from the first and second comonomer repeat units.

18. The polymer of claim 17, wherein the third comomoner repeat unit comprises a thiophene moiety.

* * * * *

UNITED STATES PATENT AND TRADEMARK OFFICE
CERTIFICATE OF CORRECTION

PATENT NO. : 9,123,895 B2  
APPLICATION NO. : 14/046567  
DATED : September 1, 2015  
INVENTOR(S) : Russell Gaudiana et al.

Page 1 of 1

It is certified that error appears in the above-identified patent and that said Letters Patent is hereby corrected as shown below:

In the specification:

Column 5, Line 5, Structure

Replace " 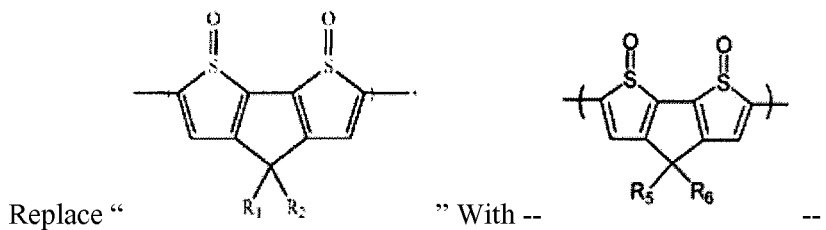 " With -- --

In the claims:

Column 22, Line 50, Claim 6, Structure 4

Replace " 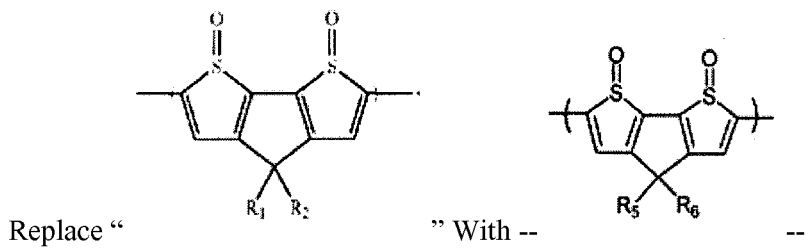 " With -- --

Signed and Sealed this  
Fifth Day of July, 2016

Michelle K. Lee  
*Director of the United States Patent and Trademark Office*